United States Patent [19]

Schnöeller

[11] 3,974,561

[45] Aug. 17, 1976

[54] METHOD OF PRODUCING DIRECTLY HEATABLE HOLLOW SEMICONDUCTOR BODIES

[75] Inventor: Manfred Schnöeller, Munich, Germany

[73] Assignee: Siemens Aktiengesellschaft, Berlin & Munich, Germany

[22] Filed: May 30, 1974

[21] Appl. No.: 474,660

[30] Foreign Application Priority Data
Aug. 8, 1973  Germany............................ 2340225

[52] U.S. Cl.............................. 29/611; 29/576 R; 29/589; 148/188; 118/49.1
[51] Int. Cl.² ........................................... H05B 3/00
[58] Field of Search ............ 29/573, 576, 589, 611, 29/620; 148/188; 118/49.1

[56] References Cited
UNITED STATES PATENTS

| 3,660,156 | 5/1972 | Schmidt | 148/188 |
| 3,751,539 | 8/1973 | Reuschel | 148/174 |
| 3,761,782 | 9/1973 | Youmans | 29/589 |
| 3,834,939 | 9/1974 | Beyer | 148/188 |
| 3,865,647 | 2/1975 | Reuschel | 148/175 |

*Primary Examiner*—W. Tupman
*Attorney, Agent, or Firm*—Hill, Gross, Simpson, Van Santen, Steadman, Chiara & Simpson

[57] ABSTRACT

Hollow semiconductor bodies are formed from a gaseous phase by deposition on a heated mandrel and end zones of a so-produced body are doped so as to be conductive at room temperature.

7 Claims, 1 Drawing Figure

U.S. Patent  Aug. 17, 1976  3,974,561
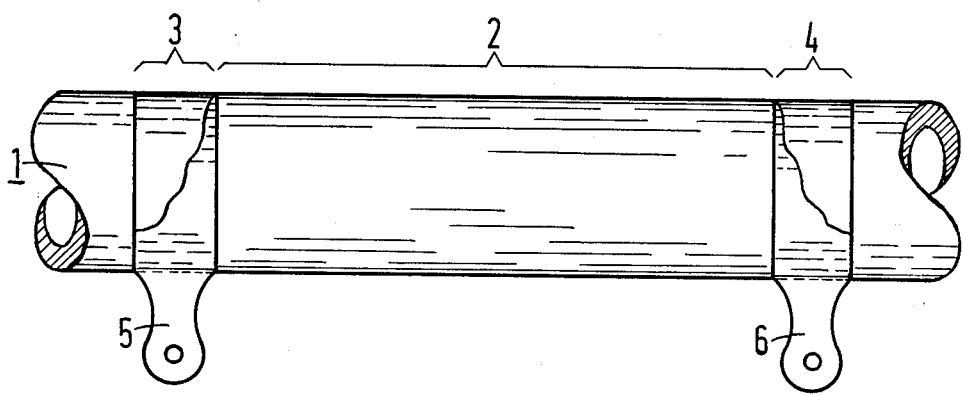

METHOD OF PRODUCING DIRECTLY HEATABLE HOLLOW SEMICONDUCTOR BODIES

BACKGROUND OF THE INVENTION

1. Field of the Invention

The invention relates to the production of hollow semiconductor bodies and somewhat more particularly to directly heatable semiconductor bodies and a method of producing the same.

2. Prior Art

In diffusion doping of semiconductor crystals, quartz tubes or ampules were generally used as a container for the crystals during the diffusion process, which requires relatively high temperatures in a suitable furnace or oven. However, quartz tubes or ampules are disadvantageous in the same manner as graphite tubes or ampules, i.e., it is necessary to avoid contact between the semiconductor crystal discs being doped and such diffusion containers. In addition, quartz diffusion containers require special diffusion ovens since quartz cannot be heated directly or by induction.

German Letters Patent No. 1,805,970 teaches a diffusion container composed of a semiconductor material instead of quartz or graphite. Such semiconductor diffusion containers are formed by depositing a select semiconductor material from a gaseous phase containing a thermally decomposable gaseous compound which yields the desired semiconductor material onto the outer surface of a heated carrier member or mandrel whereby a desired semiconductor tube or the like is formed. Thereafter, the mandrel is removed without destruction of the so-formed tube. Semiconductor tubes are able to withstand much higher temperatures than, for example, quartz or graphite tubes and accordingly allow diffusion processes utilizing such tubes to be greatly accelerated. Further, the crystal discs which are being doped can contact the semiconductor tube walls without any disadvantageous consequences.

Generally, semiconductor tubes of this type may be used as diffusion ovens. The ends of such a tube are sealed with appropriate semiconductor plugs having gas inlets and outlets therein so that gaseous doping materials, which may be mixed with a carrier gas, can be fed into the interior of the tube for diffusion into the semiconductor crystal discs therein. A heating coil may be provided about such a tube and supplied with electrical energy to heat the tube to the necessary diffusion temperatures by radiation heat. Alternatively, the coil may be provided with a high frequency energy source for induction heating of the tube. However, such a coil has a limited life expectancy and tends to give up heavy metal ions therefrom to the tube during coil operation, which may considerably impair the characteristics of the semiconductor crystals being doped.

German Offenlegungsschrift No. 1,933,128 suggests an arrangement for diffusion doping materials into semiconductor crystals wherein the diffusion container comprises a tube composed of a crystalline gas impermeable semiconductor material and which can be heated directly by a voltage source or by a high frequency source to a desired temperature. This tube may be provided with electrodes at the opposite ends thereof or it may be encompassed by an induction heating coil. In order to improve the heating of the tube during operation, a ring of a fairly conductive material, for example, graphite, is mounted about the tube. When the tube is heated directly by a voltage source, the voltage required to reach the necessary diffusion temperature is dependent on the dimension of the tube and on the conductivity characteristics of the semiconductor material forming the tube. Accordingly, the aforesaid Offenlegungsschrift suggests the use of a highly doped semiconductor material which can be economically produced into a tube so that the voltage required for the induction heating can be relatively low. Once a certain temperature is achieved, the conductivity of the tube is no longer dependent on the dopant within the semiconductor material but is only primarily dependent on the tube dimensions.

Production of extremely high purity gas impermeable tubes composed of semiconductor materials, such as silicon or silicon carbide, has become possible with the aforementioned gas phase deposition process. Such high purity tubes can only be heated with a direct current after a pre-heating process. When a doped semiconductor material forms the tube, such pre-heating is not necessary, as stated in German Offenlegungsschrift No. 1,933,128 and the tube can be heated directly. However, with doped semiconductor tubes, one has to contend with undesirable reactions between the tube dopant and the semiconductor crystal being doped, generally by some other dopant.

German Patent application Ser. No. P 22 53 411 8 owned by the instant assignee, suggests that high purity directly heatable semiconductor diffusion containers be formed as two-layer tubes or the like. In accordance with this concept, a layer of a high purity semiconductor material is deposited on a heated mandrel and then a layer of a doped semiconductor material is deposited on the high purity semiconductor layer. After the finished tube is removed from the mandrel, it has an inner surface composed of a high semiconductor material and an outer surface composed of a doped semiconductor material. Aside from the complexities of providing proper gaseous atmospheres at the proper times, the foregoing process is somewhat disadvantageous in that the outer layer dopants must be carefully selected to insure that they diffuse very slowly through the tube material since otherwise they would contaminate the primary diffusion process occurring within the tube.

SUMMARY OF THE INVENTION

The invention provides a high purity diffusion container composed of select semiconductor materials which can be directly heated without the foregoing disadvantages and a method of producing such diffusion containers.

In accordance with the principles of the invention, a high purity gas impermeable semiconductor hollow body is formed by the gas phase deposition process and is then doped at spaced-apart zones of the body for connection with current terminals whereby the body may be directly heated without pre-heat treatment and without any danger of contamination of a diffusion process carried out within such a diffusion container.

By practicing the invention, the tube areas in contact with current terminals exhibit a conductivity characteristic which is higher at room temperature than the conductivity in the actual diffusion or heating zone of the tube at temperatures of about 1400° C. In other words, during the diffusion process, the current developed heat is concentrated in the center or heating zone of the tube while the ends of the tube remain cool. Since the diffusion container is composed of highly pure (undoped) semiconductor material in the heating zone thereof, there is no possibility of introducing unwanted dopants during the diffusion process.

In a preferred embodiment of the invention, a diffusion container, such as a hollow tube, composed of a high purity semiconductor material such as, for example, silicon or silicon carbide, is doped at opposite ends thereof by the application of a coating composed of a phosphorus-containing lacquer or vehicle which evaporates without residue and subjecting the so-coated container to diffusion conditions whereby phosphorus atoms diffuse into the underlying areas of the container. A cellulose base vehicle is preferred and the amount of phosphorus therein is adjusted so that the doped areas of the diffusion container have a concentration of phosphorus greater than about $10^{20}$ atoms per cubic centimeter.

BRIEF DESCRIPTION OF THE DRAWING

The single FIGURE is a partial broken-away side elevational view of a diffusion container constructed in accordance with the principles of the invention.

DESCRIPTION OF THE PREFERRED EMBODIMENTS

The invention provides directly heatable gas impermeable diffusion containers formed from a high purity semiconductor material, such as silicon or silicon carbide, and a method of producing such containers.

In accordance with the principles of the invention, a gas phase deposition process is utilized to form a high purity, gas impermeable hollow diffusion tube on a heated carrier member or mandrel, such as composed of graphite and, after removal of the tube from the mandrel, a dopant is applied to the end zones of the tube and current terminals attached to the tube at the doped zones. In this manner, the conductivity of the doped zones is higher at room temperatures than the conductivity of the actual heating zone at diffusion temperatures, i.e. about 1400° C. Further, since the central or heating zone of such a diffusion container is composed of a highly pure (undoped) semiconductor material, there is no danger of contaminating crystal discs therein with any undesirable dopant.

A select dopant, preferably phosphorus, is incorporated within a liquid-like solution or vehicle, for example, a lacquer, which volatilizes without residue or at least without harmful residue. The dopant solution may be applied to the end zones of the tube by various means, such as brushing, dipping, etc. and after application is heated sufficiently to vaporize the vehicle and leave a layer of dopant on the coated portions of the tube, which during further heating, diffuses into the tube.

A preferred dopant solution is a lacquer formed of a cellulose base and contains an amount of phosphorus therein sufficient to provide a concentration of phosphorus at applied areas greater than about $10^{20}$ phosphorus atoms/cm$^3$.

In one embodiment of the invention, clamps composed of an aluminum material, such as aluminum or an aluminum alloy, are utilized as current terminals which are attached to the diffusion container of the invention at the doped end zones thereof. In preferred forms of this embodiment, a graphite felt or the like is interposed between the tube and clamp surfaces for improved conductivity. In practice, the clamps may be lined with the graphite felt and then applied to the tube at the doped zones thereof. It is advisable, although not absolutely necessary, to associate a heat-exchange means with the terminals to cool the same. For example, an appropriately directed air stream may be provided in association with the clamps or a fluid heat-exchange circuit (which may, for example, be connected to tap water) may be provided in working relationship with the clamps.

Referring now to the drawing, a diffusion container or tube 1 is illustrated as being open at both ends. The tube 1 has a central zone 2 composed of a high purity semiconductor material, for example, silicon, and opposing end zones 3 and 4 composed of a highly doped semiconductor material. The central zone 2 functions as a heating zone during a diffusion process. The highly doped zones 3 and 4 are formed by applying, for example, a phosphorus-containing lacquer as by brushing and then subjecting the so-coated tube to the diffusion process thereby the phosphorus diffuses into the tube material, i.e. silicon. The lacquer vaporizes during the diffusion process, which may involve temperatures of about 1350° C. for a period of time greater than 24 hours and phosphorus atoms are incorporated into the silicon lattice at a concentration in the range of about $10^{20}$ phosphorus atoms per cubic centimeter. After the diffusion has been completed, the tube 1 has two doped ends and clamps 5 and 6, for example, composed of aluminum, are attached to the tube at such ends as current terminals.

Silicon tubes may be produced in accordance with the principles of the invention which are directly heatable and which are especially suitable for diffusion processes in the semiconductor art because of their excellent gas impermeability and high purity of materials.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto appendant claims.

I claim:

1. A method of producing a directly heatable hollow diffusion body composed of a semiconductor material comprising:
    forming a hollow body about a heated carrier member by a gas phase deposition process;
    removing the so-formed hollow body from the carrier member;
    coating select spaced-apart surface zones of said hollow body with a dopant-containing lacquer which includes sufficient dopant to provide a concentration greater than $10^{20}$ atoms of dopant per cubic centimeter in the doped zones of the hollow body, said lacquer vaporizing without residue remaining on said zones;
    subjecting the so-coated body to diffusion conditions sufficient to diffuse said dopant into the coated zones of said body; and
    attaching current terminals to the doped zones of said body whereby current supply to said terminals heats the body directly to select temperatures.

2. A method as defined in claim 1 wherein said dopant is phosphorus.

3. A method as defined in claim 1 wherein said lacquer comprises a cellulose base.

4. A method as defined in claim 1 wherein said current terminals are composed of an aluminum material.

5. A method as defined in claim 4 wherein said current terminals are lined with a graphite felt.

6. A method as defined in claim 5 wherein said current terminals are associated with a heat-exchange means for cooling said terminals.

7. A method of producing a directly heatable hollow body composed of a semiconductor material comprising:

forming a hollow body about a heated carrier member by a gas phase deposition process from a thermally decomposable gaseous semiconductor compound yielding a highly pure semiconductor material selected from the group consisting of silicon and silicon carbide;

removing the so-formed body from the carrier member;

preparing a cellulose based lacquer containing an amount of phosphorus therein sufficient to provide a concentration greater than about $10^{20}$ atoms of phosphorus per cubic centimeter of an applied area and applying said lacquer to spaced-apart ends zones of said body;

subjecting the resultant body to diffusion conditions sufficient to vaporize said lacquer and diffuse phosphorus into the end zones of said body; and attaching current terminals to the doped end zones of said body whereby current applied to said terminals directly heats the body to a desired temperature.

* * * * *